(12) United States Patent
Das et al.

(10) Patent No.: US 10,707,858 B2
(45) Date of Patent: *Jul. 7, 2020

(54) POWER MODULE WITH IMPROVED RELIABILITY

(71) Applicant: Cree, Inc., Durham, NC (US)

(72) Inventors: Mrinal K. Das, Morrisville, NC (US); Adam Barkley, Raleigh, NC (US); Brian Fetzer, Raleigh, NC (US); Jonathan Young, Fuquay Varina, NC (US); Van Mieczkowski, Apex, NC (US); Scott Allen, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/980,101

(22) Filed: May 15, 2018

(65) Prior Publication Data

US 2018/0331679 A1    Nov. 15, 2018

Related U.S. Application Data

(63) Continuation of application No. 15/594,868, filed on May 15, 2017, now Pat. No. 9,998,109.

(51) Int. Cl.
*H01L 29/76* (2006.01)
*H01L 29/94* (2006.01)
(Continued)

(52) U.S. Cl.
CPC ....... *H03K 17/107* (2013.01); *H01L 23/3171* (2013.01); *H01L 23/3192* (2013.01);
(Continued)

(58) Field of Classification Search
CPC .......... H01L 29/7816; H01L 29/66681; H01L 2924/13091; H01L 29/7813;
(Continued)

(56) References Cited

U.S. PATENT DOCUMENTS 9,373,617 B2   6/2016  Das et al.
9,998,109 B1 * 6/2018  Das ..................... H01L 23/3192
(Continued)

OTHER PUBLICATIONS

Unknown, "CAS300M12BM2," Datasheet, 1.2kV, 4.2 mΩ All-Silicon Carbide Half-Bridge Module, C2M MOSFET and Z-Rec™ Diode, Rev. A, 2014, www.cree.com/power, Cree, Inc., 9 pages.
(Continued)

*Primary Examiner* — Theresa T Doan
(74) *Attorney, Agent, or Firm* — Withrow & Terranova, P.L.L.C.

(57) ABSTRACT

A power module includes a first terminal, a second terminal, and a number of semiconductor die coupled between the first terminal and the second terminal. The semiconductor die are configured to provide a low-resistance path for current flow from the first terminal to the second terminal during a forward conduction mode of operation and a high-resistance path for current flow from the first terminal to the second terminal during a forward blocking configuration. Due to improvements made to the power module, it is able to pass a temperature, humidity, and bias test at 80% of its rated voltage for at least 1000 hours.

21 Claims, 7 Drawing Sheets

(51) Int. Cl.

| | |
|---|---|
| H03K 17/10 | (2006.01) |
| H02M 7/00 | (2006.01) |
| H02M 3/158 | (2006.01) |
| H01L 23/31 | (2006.01) |
| H01L 29/16 | (2006.01) |
| H01L 29/78 | (2006.01) |
| H03K 17/12 | (2006.01) |
| H03K 17/74 | (2006.01) |
| H01L 23/00 | (2006.01) |
| H01L 23/373 | (2006.01) |
| H01L 23/482 | (2006.01) |
| H01L 23/528 | (2006.01) |
| H01L 23/532 | (2006.01) |
| H01L 29/872 | (2006.01) |
| H01L 25/11 | (2006.01) |
| H01L 29/06 | (2006.01) |
| H01L 25/07 | (2006.01) |
| H01L 29/739 | (2006.01) |

(52) U.S. Cl.
CPC ........ *H01L 23/3735* (2013.01); *H01L 23/482* (2013.01); *H01L 23/4827* (2013.01); *H01L 23/528* (2013.01); *H01L 23/53219* (2013.01); *H01L 23/53247* (2013.01); *H01L 24/05* (2013.01); *H01L 24/29* (2013.01); *H01L 24/32* (2013.01); *H01L 29/1608* (2013.01); *H01L 29/7806* (2013.01); *H02M 3/158* (2013.01); *H02M 7/003* (2013.01); *H03K 17/122* (2013.01); *H03K 17/127* (2013.01); *H03K 17/74* (2013.01); *H01L 25/072* (2013.01); *H01L 25/115* (2013.01); *H01L 29/0619* (2013.01); *H01L 29/7395* (2013.01); *H01L 29/872* (2013.01); *H01L 2224/04026* (2013.01); *H01L 2224/05166* (2013.01); *H01L 2224/05611* (2013.01); *H01L 2224/05624* (2013.01); *H01L 2224/05644* (2013.01); *H01L 2224/05655* (2013.01); *H01L 2224/29111* (2013.01); *H01L 2224/32225* (2013.01); *H01L 2224/48137* (2013.01); *H01L 2224/73265* (2013.01); *H01L 2924/10272* (2013.01); *H01L 2924/12032* (2013.01); *H01L 2924/13091* (2013.01); *H01L 2924/15192* (2013.01)

(58) Field of Classification Search
CPC ............. H01L 29/7833; H01L 29/7802; H01L 29/0852; H01L 29/518; H01L 23/528
USPC ........................................................ 257/337
See application file for complete search history.

(56) References Cited

U.S. PATENT DOCUMENTS

| | | | |
|---|---|---|---|
| 2003/0160274 A1* | 8/2003 | Das ................. | H01L 21/045 257/306 |
| 2003/0194853 A1* | 10/2003 | Jeon ................ | H01L 21/28185 438/591 |
| 2007/0001176 A1 | 1/2007 | Ward, III et al. | |
| 2009/0095979 A1 | 4/2009 | Saito et al. | |
| 2014/0264960 A1 | 9/2014 | Ring et al. | |
| 2014/0299890 A1* | 10/2014 | Matocha ............ | H01L 29/1608 257/77 |
| 2015/0262814 A1 | 9/2015 | Plappert et al. | |
| 2016/0104614 A1 | 4/2016 | Hasegawa et al. | |
| 2016/0204101 A1 | 7/2016 | Das et al. | |

OTHER PUBLICATIONS

Notice of Allowance for U.S. Appl. No. 15/594,868, dated Feb. 14, 2018, 8 pages.

Invitation to Pay Additional Fees for International Patent Application No. PCT/US2018/032653, mailed Aug. 27, 2018, 14 pages.

Colmenares, Juan, et al., "Reliability Analysis of a High-Efficiency SiC Three-Phase Inverter," IEEE Journal of Emerging and Selected Topics in Power Electronics, vol. 4, No. 3, Sep. 1, 2016, pp. 996-1006.

International Search Report and Written Opinion for International Patent Application No. PCT/US2018/032653, dated Oct. 18, 2018, 21 pages.

International Preliminary Report on Patentability for International Patent Application No. PCT/US2018/032653, dated Nov. 28, 2019, 13 pages.

* cited by examiner

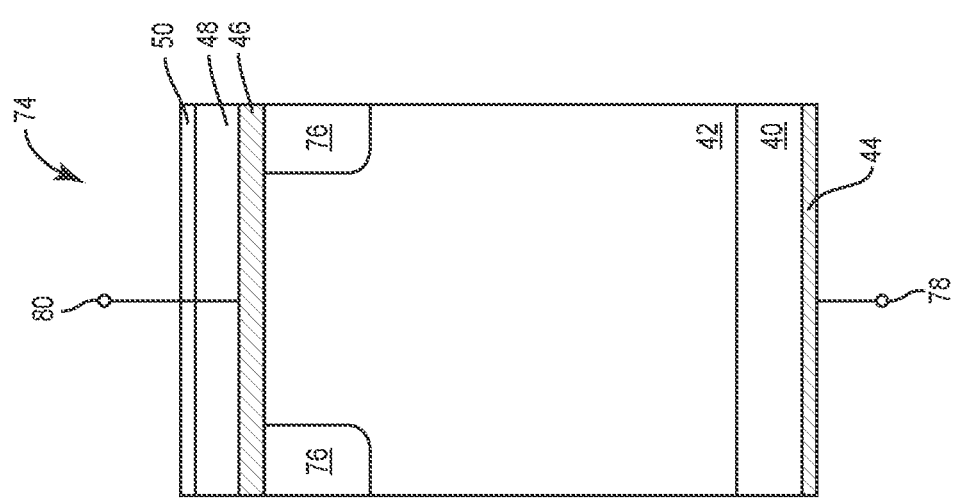
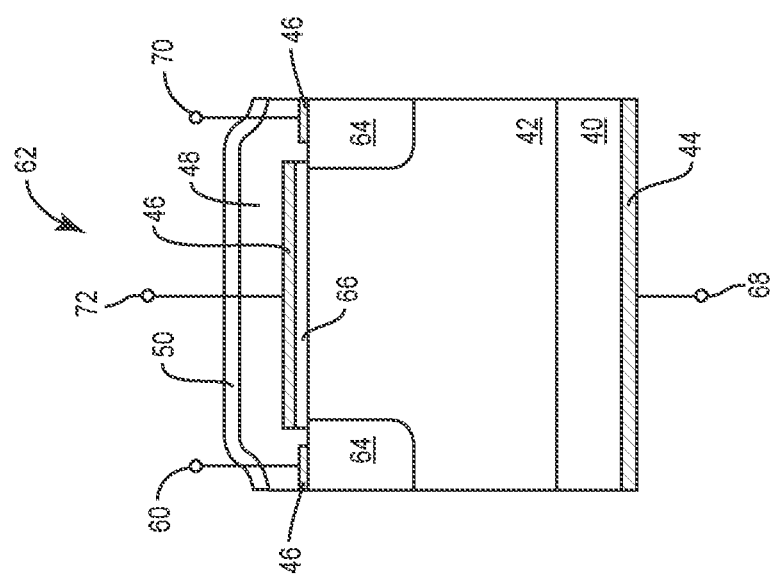

POWER MODULE WITH IMPROVED RELIABILITY

RELATED APPLICATIONS

This application is a continuation of U.S. patent application Ser. No. 15/594,868, filed May 15, 2017, now U.S. Pat. No. 9,998,109, the disclosure of which is hereby incorporated herein by reference in its entirety.

FIELD OF THE DISCLOSURE

The present disclosure relates to power modules, and specifically to power modules including silicon carbide switching semiconductor components with improved ruggedness and reliability.

BACKGROUND

A power module is used to selectively deliver power to a load. The primary function of a power module is provided by a number of switching semiconductor devices (e.g., transistors and diodes) within the power module. When provided in a power system with one or more other power modules and/or one or more other components, the switching semiconductor devices of a power module may form part of a power converter such as a half-bridge converter, a full-bridge converter, a buck converter, a boost converter, and the like. Power systems often deal with relatively high voltages and currents, and thus the switching semiconductor devices of a power module must similarly be capable of reliably switching these high voltages and currents.

Conventionally, the switching semiconductor devices of a power module have been silicon devices due to well-known processes for producing silicon switching semiconductor devices capable of reliably switching high voltages and currents. However, in recent years silicon carbide semiconductor switching devices for power modules have become popularized due to significant increases in switching speed and efficiency afforded by the use of silicon carbide. While power modules with silicon carbide semiconductor switching devices provide several performance benefits over their silicon counterparts, using silicon carbide semiconductor switching devices in a power module presents several challenges in the design thereof. Specifically, increased power density and concentrated electric fields in silicon carbide semiconductor switching devices often lead to issues with the long-term reliability of power modules incorporating them.

One way to measure the reliability of a power module is with a test known as a temperature, humidity, and bias (THB) test. Conventionally, THB tests have been conducted by providing a device under test (DUT) in an environment with fixed temperature (e.g., 85° C.) and relative humidity (e.g., 85%) while providing a fixed bias voltage (e.g., 100V) across the DUT in a reverse bias (i.e., blocking) state. The DUT should be capable of sustaining the bias voltage across the device without breaking down (i.e., exceeding a threshold for a leakage current through the device) for thousand(s) of hours to ensure the reliability of the DUT in a production environment. Recently, more rigorous THB tests for high power devices have emerged in which 80% of a rated voltage of the DUT is provided across the device during the same conditions discussed above. Known in the industry as a "THB80" or "HV-H3TRB" (high-voltage, high-temperature, high-reverse-bias) tests, these reliability tests more accurately reflect the reliability of a device in use, and are crucial indicators of reliability for power modules that will be operated in harsh environments such as outdoor power systems.

Notably, THB tests can be performed both at a die level and at a module level. When a THB test is performed at the die level, a semiconductor die is subjected to the conditions discussed above and the reliability of the die is assessed. When a THB test is performed at the module level, an assembled power module including several semiconductor die is subjected to the conditions discussed above and the reliability of the module as a whole is assessed. THB tests performed at the module level are significantly more difficult to pass, as the complexity of a power module is significantly greater than that of a single semiconductor die and thus presents many more points of failure when compared to a semiconductor die. Further, THB tests performed at the module level are much more likely to indicate the real-world reliability of a power module when compared to extrapolations of reliability from THB tests performed on the semiconductor die included within the power module. As power modules including silicon carbide switching semiconductor devices have become more popular, customer demand for these power modules for applications in harsh environments has similarly grown. However, the reliability of power modules including silicon carbide semiconductor switching components has thus far proved an impediment to their adoption in these spaces. Specifically, power modules including silicon carbide semiconductor switching components have thus far been incapable of satisfactory performance in the THB80 tests discussed above.

In light of the above, there is a present need for power modules including silicon carbide semiconductor switching components with improved ruggedness and reliability.

SUMMARY

In one embodiment, a power module includes a first terminal, a second terminal, and a number of silicon carbide (SiC) semiconductor die coupled between the first terminal and the second terminal. The semiconductor die are configured to provide a low-resistance path for current flow from the first terminal to the second terminal during a forward conduction mode of operation such that a resistance between the first terminal and the second terminal is less than 100 mΩ during the forward conduction mode of operation. Further, the semiconductor die are configured to provide a high-resistance path for current flow from the first terminal to the second terminal during a forward blocking mode of operation such that a leakage current between the first terminal and the second terminal is less than 20 mA when a voltage of at least 80% of the rated voltage of the power module is provided across the first terminal and the second terminal during the forward blocking mode of operation, where the rated voltage of the power module is at least 600V. The power module is capable of maintaining the voltage of at least 80% of the rated voltage across the first terminal and the second terminal for a period of at least 1000 hours at a temperature of at least 85° C. and a relative humidity of at least 85% without failure.

In one embodiment, each one of the semiconductor die includes a substrate, a drift layer over the substrate, and a passivation layer stack over the drift layer. The passivation layer stack includes a number of passivation layers such that a composition of the passivation layers alternates between at least a first material and a second material. Arranging the passivation layer stack in this manner substantially increases the reliability of the power module as it prevents delamination and corrosion that may otherwise damage the semiconductor die of the power module and cause a failure thereof.

In one embodiment, the passivation layer stack over the drift layer in each one of the semiconductor die includes at least four layers. Further, the passivation layer stack may be at least 1.6 µm thick. Providing the passivation layer stack such that it is at least 1.6 µm thick further prevents delamination and corrosion that may otherwise damage the semiconductor die of the power module and cause a failure thereof.

In one embodiment, each one of the semiconductor die includes a back-side metallization layer on the substrate opposite the drift layer. The back-side metallization layer may form a drain contact of a metal-oxide-semiconductor field-effect transistor (MOSFET) and/or an anode contact of a Schottky diode, and is substantially free of silver. By using a back-side metallization layer that is substantially free of silver, electromigration of silver that is normally located in the back-side metallization layer may be prevented, thereby increasing the reliability of the power module by reducing short-circuits often caused thereby.

In one embodiment, the power module further includes a power electronic substrate on which the semiconductor die are mounted via a die attach material. Both the power electronic substrate and the die attach material are substantially free of silver. Accordingly, electromigration of silver that is normally located in the power electronic substrate and the die attach material may be prevented, thereby increasing the reliability of the power module by reducing short-circuits caused thereby.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 6A and 6B are cross-sectional views of semiconductor devices formed on a semiconductor die according to one embodiment of the present disclosure.

DETAILED DESCRIPTION

Figure 1:
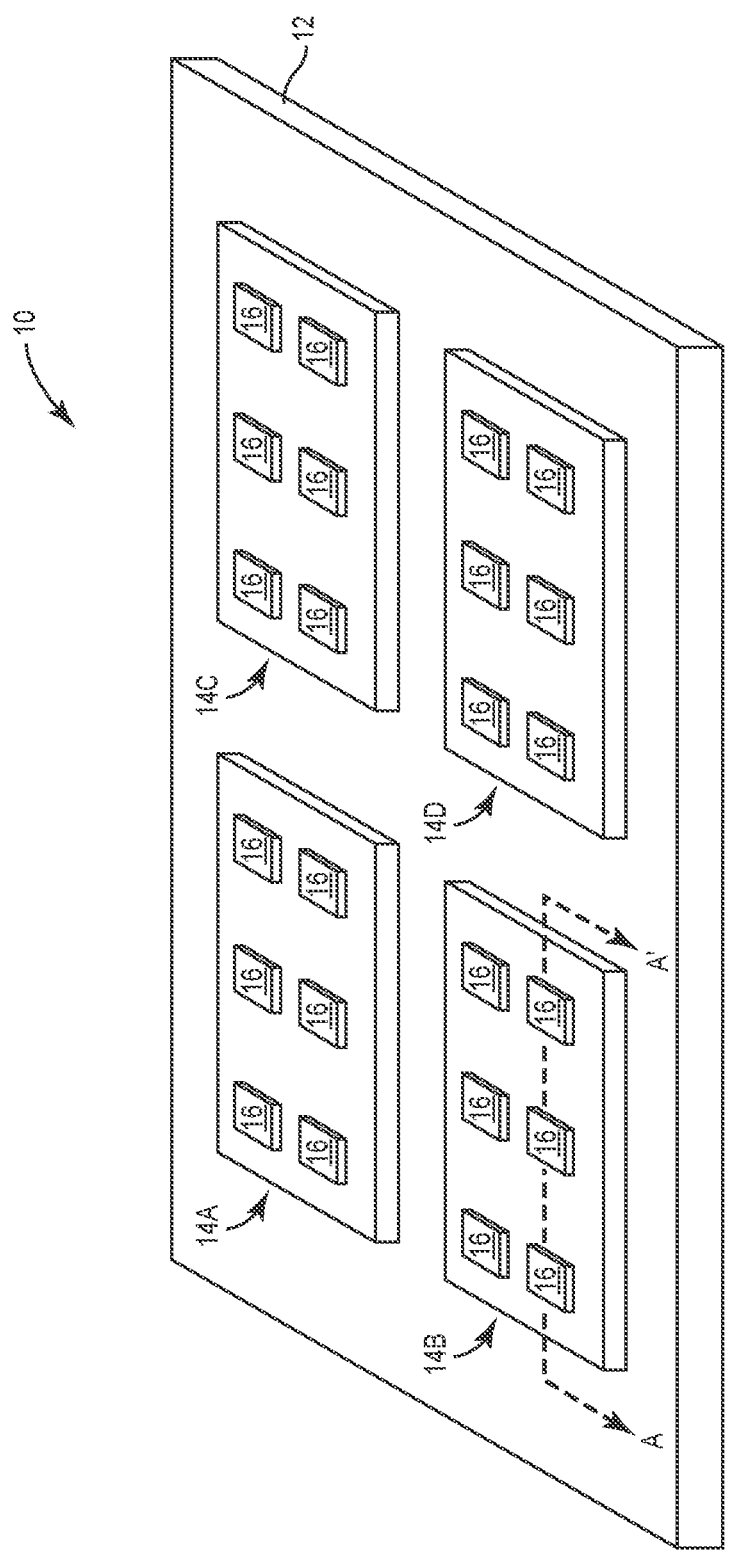
FIG. 1 is an isometric view of a power module according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is an isometric view of a power module 10 according to one embodiment of the present disclosure. The power module 10 includes a baseplate 12, a number of sub-modules 14 (individually 14A-14D) on the baseplate 12, and a number of semiconductor die 16 on the sub-modules 14. Each one of the semiconductor die 16 provides a switching semiconductor device. For example, half of the semiconductor die 16 may provide a transistor such as a metal-oxide-semiconductor field-effect transistor (MOSFET) while the other half of the semiconductor die 16 may provide a diode such as a Schottky diode. While not shown to avoid obscuring the drawings, the semiconductor die 16 are connected to one another by interconnects, which may be provided as metal traces on the sub-modules 14 and/or wire-bonds between the devices. A number of terminals may provide connection points to the semiconductor die as discussed below.

While the power module 10 is shown including four sub-modules 14, each of which includes six semiconductor die 16, the present disclosure is not so limited. Those skilled in the art will appreciate that any number of sub-modules 14 may be provided on the baseplate, each of which includes any number of semiconductor die 16 without departing from the principles of the present disclosure.

Figure 2B:
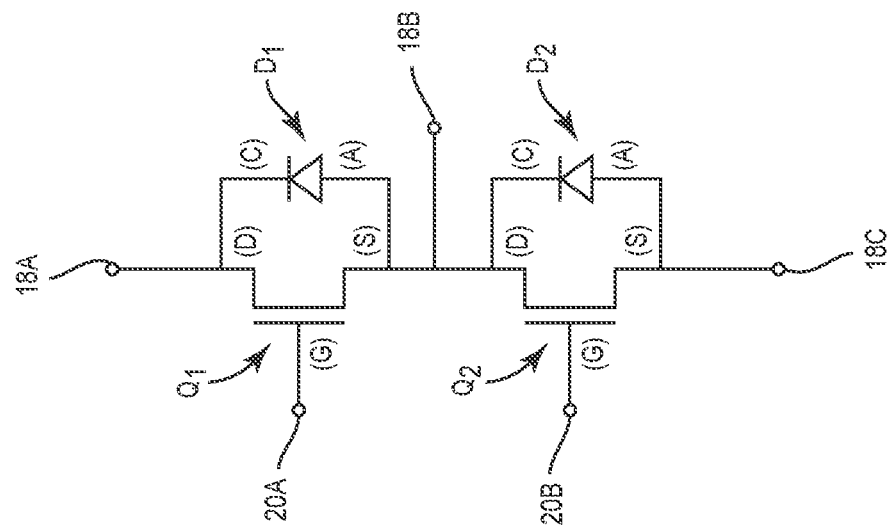
FIGS. 2A and 2B are functional schematics of a power module according to one embodiment of the present disclosure.
Figure 2A:
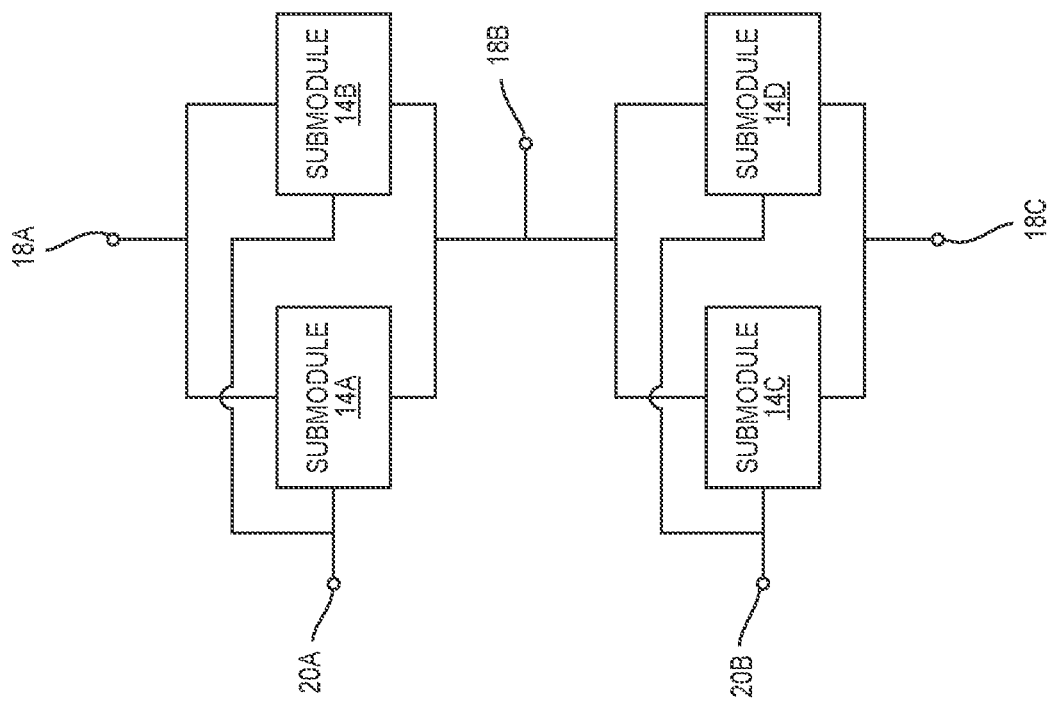

FIGS. 2A and 2B show a functional schematic of the power module 10 according to one embodiment of the present disclosure. Specifically, FIG. 2A shows the interconnection between the sub-modules 14 in the power module 10, while FIG. 2B shows the resulting circuit provided by the power module 10. As shown in FIG. 2A, a first sub-module 14A and a second sub-module 14B are coupled in parallel with one another between a first terminal 18A and a second terminal 18B. A third sub-module 14C and a fourth sub-module 14D are similarly connected in parallel between the second terminal 18B and a third terminal 18C. A first control terminal 20A is connected to both the first sub-module 14A and the second sub-module 14B. A second control terminal 20B is connected to both the third sub-module 14C and the fourth sub-module 14D.

As shown in FIG. 2B, the first sub-module 14A and the second sub-module 14B form a first MOSFET $Q_1$ coupled in anti-parallel with a first diode $D_1$, while the third sub-module 14C and the fourth sub-module 14D form a second MOSFET $Q_2$ coupled in anti-parallel with a second diode $D_2$. The first MOSFET $Q_1$ and the first diode $D_1$ are coupled between the first terminal 18A and the second terminal 18B. Specifically, the first terminal 18A is coupled to a drain contact (D) of the first MOSFET $Q_1$ and a cathode contact (C) of the first diode $D_1$ and the second terminal 18B is coupled to a source contact (S) of the first MOSFET $Q_1$ and an anode contact (A) of the first diode $D_1$. The first control terminal 20A is coupled to a gate contact (G) of the first MOSFET $Q_1$. The second MOSFET $Q_2$ and the second diode $D_2$ are coupled between the second terminal 18B and the third terminal 18C. Specifically, the second terminal 18B is coupled to a drain contact (D) of the second MOSFET $Q_2$ and a cathode contact (C) of the second diode $D_2$ and the third terminal 18C is coupled to a source contact (S) of the second MOSFET $Q_2$ and an anode contact (A) of the second diode $D_2$. The second control terminal 20B is coupled to a gate contact (G) of the second MOSFET $Q_2$.

When a voltage provided at the gate contact (G) of the first MOSFET $Q_1$ via the first control terminal 20A is above a threshold voltage of the device and a voltage provided at the drain contact (D) is positive with respect to a voltage provided at the source contact (S) thereof, the first MOSFET $Q_1$ is in a forward conduction mode of operation and is thus configured to provide a low-resistance path for current flow between the first terminal 18A and the second terminal 18B. The first diode $D_1$ is reverse biased in this configuration and thus current does not flow through the first diode $D_1$. Similarly, when a voltage provided at the gate contact (G) of the second MOSFET $Q_2$ via the second control terminal 20B is above a threshold voltage of the device and a voltage provided at the drain contact (D) is positive with respect to a voltage provided at the source contact (S) thereof, the second MOSFET $Q_2$ is in a forward conduction mode of operation and is thus configured to provide a low-resistance path for current flow between the second terminal 18B and the third terminal 18C. The second diode $D_2$ is reverse biased in this configuration and thus current does not flow through the second diode $D_2$. As defined herein, a low-resistance path is a path with negligible resistance, and is equal to the on-state resistance of the first MOSFET $Q_1$ or the second MOSFET $Q_2$. The on-state resistance of the first MOSFET $Q_1$ and the second MOSFET $Q_2$ may vary depending on the power handling capability thereof. Generally, however, the low-resistance path can be defined as having a resistance less than 100 mΩ.

When a voltage provided at the gate contact (G) of the first MOSFET $Q_1$ via the first control terminal 20A is below a threshold voltage of the device and a voltage provided at the drain contact (D) is positive with respect to a voltage provided at the source contact (S) thereof, the first MOSFET $Q_1$ is in a forward blocking configuration and is thus configured to provide a high-resistance path for current flow between the first terminal 18A and the second terminal 18B. The first diode $D_1$ is reverse biased in this configuration and thus current does not flow through the first diode $D_1$. Similarly, when a voltage provided at the gate contact (G) of the second MOSFET $Q_2$ via the second control terminal 20B is below a threshold voltage of the device and a voltage provided at the drain contact (D) is positive with respect to a voltage provided at the source contact (S) thereof, the second MOSFET $Q_2$ is in a forward blocking configuration and is thus configured to provide a high-resistance path for current flow between the second terminal 18B and the third terminal 18C. The second diode $D_2$ is reverse biased in this configuration and thus current does not flow through the second diode $D_2$. As defined herein, a high-resistance path is one with a practically infinite resistance, and is equal to the off-state resistance of the first MOSFET $Q_1$ and the second MOSFET $Q_2$. The off-state resistance of the first MOSFET $Q_1$ and the second MOSFET $Q_2$ may vary depending on the power handling capability thereof. Generally, however, the high-resistance path can be defined as having a resistance that is substantially larger than that of the low-resistance path, and greater than 100 kΩ.

When a voltage provided at the drain contact (D) of the first MOSFET $Q_1$ is negative with respect to a voltage provided at the source contact (S), the first MOSFET $Q_1$ is in a reverse blocking configuration and continues to provide a high-resistance path for current flow between the first terminal 18A and the second terminal 18B. The first diode $D_1$ is forward biased in this configuration and thus allows current flow from the second terminal 18B to the first terminal 18A. Similarly, when a voltage provided at the drain contact (D) of the second MOSFET $Q_2$ is negative with respect to the source contact (S) thereof, the second MOSFET $Q_2$ is in a reverse blocking configuration and continues to provide a high-resistance path for current flow between the second terminal 18B and the third terminal 18C. The second diode $D_2$ is forward biased in this configuration and thus allows current flow from the third terminal 18C to the second terminal 18B.

Those skilled in the art will thus appreciate that the power module 10 illustrated in FIGS. 2A and 2B is a half-bridge power module. However, the present disclosure is not so limited. The principles described herein may be applied to power modules of any configuration, such as those including more or less switching elements arranged in any number or configurations. Further, while the transistor devices of the power module 10 are described above as MOSFETs, any type of transistor devices may be used in the power module 10 without departing from the principles herein. For example, insulated gate bipolar transistors (IGBTs) may be substituted for the first MOSFET $Q_1$ and the second MOSFET $Q_2$ in some embodiments. Similarly, the first diode $D_1$ and the second diode $D_2$ may be any type of diode without departing from the principles described herein. For example, the first diode $D_1$ and the second diode $D_2$ may be Schottky diodes, Schottky barrier diodes (SBDs), or may even be provided as a built-in body diode of the first MOSFET $Q_1$ and the second MOSFET $Q_2$ described above such that the first diode $D_1$ is integral with the first MOSFET $Q_1$ and the second diode $D_2$ is integral with the second MOSFET $Q_2$. Even when the first diode $D_1$ is not formed by the built-in body diode of the first MOSFET $Q_1$, the first diode $D_1$ may be monolithically integrated with the first MOSFET $Q_1$ on the same semiconductor die in some embodiments. Similarly, even when the second diode $D_2$ is not formed by the built-in body diode of the second MOSFET 02, the second diode $D_2$ may be monolithically integrated with the second MOSFET $Q_2$ on the same semiconductor die in some embodiments.

Figure 3:
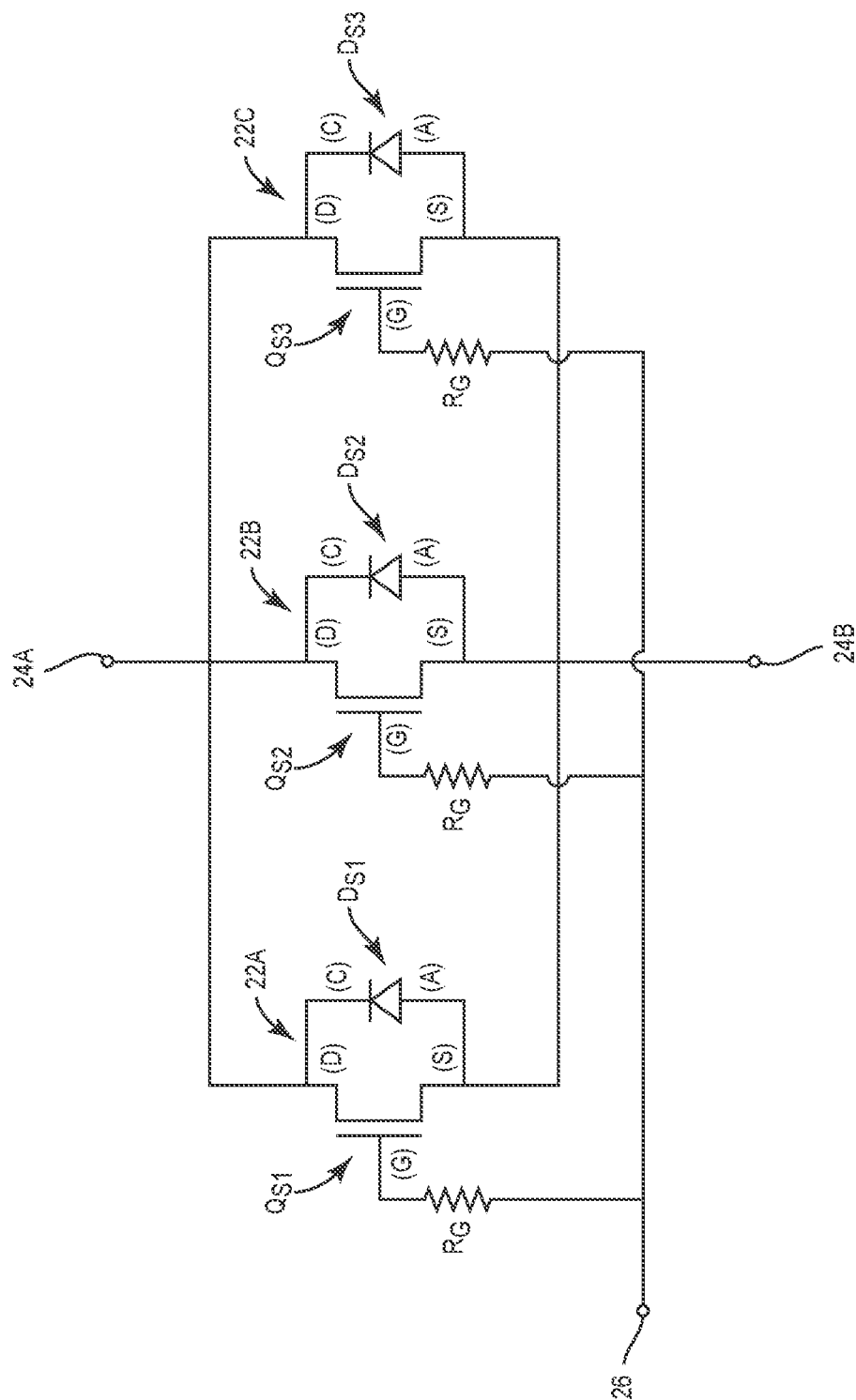
FIG. 3 is a functional schematic of a power module according to one embodiment of the present disclosure.

FIG. 3 is a functional schematic illustrating details of each one of the sub-modules 14. As illustrated in FIG. 3, each one of the sub-modules 14 includes a first transistor-diode pair 22A including a first sub-module MOSFET $Q_{S1}$ coupled in anti-parallel with a first sub-module diode $D_{S1}$, a second transistor-diode pair 22B including a second sub-module MOSFET $Q_{S2}$ coupled in anti-parallel with a second sub-module diode $D_{S2}$, and a third transistor-diode pair 22C including a third sub-module MOSFET $Q_{S3}$ coupled in anti-parallel with a third sub-module diode $D_{S3}$. The first transistor-diode pair 22A, the second transistor-diode pair 22B, and the third transistor-diode pair 22C are coupled in parallel between a first sub-module terminal 24A and a second sub-module terminal 24B. Specifically, the first sub-module terminal 24A is coupled to a drain contact (D) of each one of the first sub-module MOSFET $Q_{S1}$, the second sub-module MOSFET $Q_{S2}$, and the third sub-module MOSFET $Q_{S3}$ and a cathode contact (C) of each one of the first sub-module diode $D_{S1}$, the second sub-module diode $D_{S2}$, and the third sub-module diode $D_{S3}$. The second sub-module terminal 24B is coupled to a source contact (S) of each one of the first sub-module MOSFET $Q_{S1}$, the second sub-module MOSFET $Q_{S2}$, and the third sub-module MOSFET $Q_{S3}$ and an anode contact (A) of each one of the first sub-module diode $D_{S1}$, the second sub-module diode $D_{S2}$, and the third sub-module diode $D_{S3}$. A sub-module control terminal 26 is coupled to a gate contact (G) of each one of the first sub-module MOSFET $Q_{S1}$, the second sub-module MOSFET $Q_{S2}$, and the third sub-module MOSFET $Q_{S3}$ via separate gate resistors $R_G$.

In the case that the sub-module 14 illustrated in FIG. 3 is the first sub-module 14A or the second sub-module 14B, the first sub-module terminal 24A is coupled to the first terminal 18A (see FIG. 2A), the second sub-module terminal 24B is coupled to the second terminal 18B, and the sub-module control terminal 26 is coupled to the first control terminal 20A. In the case that the sub-module 14 illustrated in FIG. 3 is the third sub-module 14C or the fourth sub-module 14D, the first sub-module terminal 24A is coupled to the second terminal 18B, the second sub-module terminal 24B is coupled to the third terminal 18C, and the sub-module control terminal 26 is coupled to the second control terminal 20B.

The first sub-module MOSFET $Q_{S1}$, the second sub-module MOSFET $Q_{S2}$, and the third sub-module MOSFET $Q_{S3}$ effectively form a single MOSFET between the first sub-module terminal 24A and the second sub-module terminal 24B. Similarly, the first sub-module diode $D_{S1}$, the second sub-module diode $D_{S2}$, and the third sub-module diode $D_{S3}$ effectively form a single diode between the first sub-module terminal 24A and the second sub-module terminal 24B. When the first sub-module 14A and the second sub-module 14B are coupled in parallel between the first terminal 18A and the second terminal 18B, these sub-modules effectively form the first MOSFET $Q_1$ and the first diode $D_1$ (see FIG. 2B). When the third sub-module 14C and the fourth sub-module 14D are coupled in parallel between the second terminal 18B and the third terminal 18C, these sub-modules effectively form the second MOSFET $Q_2$ and the second diode $D_2$.

The first sub-module MOSFET $Q_{S1}$, the second sub-module MOSFET $Q_{S2}$, and the third sub-module MOSFET $Q_{S3}$ may be rated for a maximum drain-to-source voltage $V_{DSmax}$ of 1.2 kV and an on-state resistance of about 25.2 mΩ. When provided in parallel with the MOSFETs of another sub-module 14 in the power module 10 as discussed above to provide six parallel MOSFETs, the on-state resistance of each one of the first MOSFET $Q_1$ and the second MOSFET $Q_2$ is thus around 4.2 mΩ. The MOSFETs and diodes used in the power module 10 may be identical to those of part number CAS300M12BM2 manufactured by Cree, Inc. of Durham, N.C., the datasheet of which is herein incorporated by reference in its entirety. Accordingly, the power module 10 may share the same performance as this part including blocking voltage, on-state resistance, leakage current, and the like. Those skilled in the art will appreciate that the above-mentioned performance characteristics of the power module 10 are merely exemplary, and that the principles of the present disclosure may apply to power modules rated for any application and thus having different blocking voltages, current handling capabilities, on-state resistances, and the like. For example, the principles of the present disclosure may apply to power modules rated as low as 600V and up to 15 kV. In these embodiments, additional MOSFETs and diodes may be used to achieve different performance characteristics, and the performance characteristics of the MOSFETs and diodes themselves may be different (e.g., the MOSFETs and diodes may individually be rated for a maximum drain-to-source voltage between 600V and 15 kV and provide different on-state resistances as a result).

The first sub-module MOSFET $Q_{S1}$, the second sub-module MOSFET $Q_{S2}$, the third sub-module MOSFET $Q_{S3}$, the first sub-module diode $D_{S1}$, the second sub-module diode $D_{S2}$, and the third sub-module diode $D_{S3}$ may each be provided by discrete semiconductor die 16 as illustrated in FIG. 1. As discussed above, however, the diodes may be combined with the MOSFETs on the same semiconductor die in certain embodiments. The semiconductor die 16 may be silicon carbide (SiC) semiconductor die in some embodiments. As discussed above, using SiC semiconductor die in a power module may provide several improvements in performance such as in switching speed and efficiency. However, the ruggedness and thus reliability of power modules including SiC semiconductor die has thus far been unsatisfactory.

Accordingly, several improvements are made to the power module 10 in order to increase the ruggedness and thus reliability thereof, all of which are introduced here and discussed in detail below. First, a passivation layer stack is provided over each one of the semiconductor die 16 to reduce corrosion and delamination. The passivation layer stack includes several passivation layers, the composition of which alternates from one layer to the other. In some embodiments, at least five alternating passivation layers are included in the passivation layer stack. A thickness of the passivation layer stack may be greater than 1.6 µm in certain embodiments, and the passivation layers may be provided according to a plasma-enhanced chemical vapor deposition (PECVD) process to increase the quality of the layers. Second, a back-side metallization layer of each one of the semiconductor die 16 may be provided such that it is substantially free of silver to reduce electromigration of silver towards one or more contacts located on the die. Third, each one of the semiconductor die 16 may be provided such that a dicing street thereof is substantially free of nickel (which may normally be provided to form a grounding ring) to reduce electromigration thereof towards one or more contacts located on the die. Fourth, each one of the semiconductor die 16 may be attached to a power electronic substrate of the sub-modules 14 using a die attach material that is substantially free of silver, once again to reduce electromigration of silver towards one or more contacts located on the die. Similarly, each one of the sub-modules 14 may be attached to the baseplate 12 using a substrate attach material that is substantially free of silver, and a power electronic substrate in the sub-modules 14 may be substantially free of silver. Fifth, the power module 10 may be subjected to a rigorous cleaning process after assembly thereof in order to reduce contaminants located on the power module 10 that may lead to corrosion during operation thereof. Finally, the materials selected for the power module 10 may be chosen based on ion chromatography tests that require exceedingly low levels of contaminants in the materials, as these contaminants may lead to corrosion during operation of the power module 10.

Providing the power module 10 in this manner may allow the power module 10 to pass a temperature, humidity, and bias (THB) test operated at 80% of its rated blocking voltage (i.e., a THB80 test) exceeding 1000 hours, 1500 hours, and even 2000 hours. As discussed herein, "passing" a THB test entails maintaining a leakage current between at least two terminals below a threshold value while maintaining a voltage across these terminals. In one embodiment, the threshold value for the leakage current is below 20 mA. Notably, the power module 10 in its entirety is capable of passing this test, and not just the semiconductor die 16 in the power module 10. The THB test may be performed on only one of the first MOSFET $Q_1$ and first diode $D_1$ or the second MOSFET $Q_2$ and second diode $D_2$ in various embodiments. In the embodiment in which the power module 10 is a 1.2 kV power module as discussed above, 80% of 1.2 kV or 960V may be provided between the second terminal 18B and the third terminal 18C. The first terminal 18A may be coupled to the second terminal 18B during the test such that the first MOSFET $Q_1$ and the first diode $D_1$ are short-circuited. Further, the first control terminal 20A may be coupled to the second terminal 18B and the second control terminal 20B may be coupled to the third terminal 18C. The result is that the first MOSFET $Q_1$ and the first diode $D_1$ are short-circuited while the second MOSFET $Q_2$ is in a forward blocking configuration and the second diode $D_2$ is in a reverse bias configuration. The power module 10 may be provided in an environment having a temperature of at least 85° C. and a relative humidity of at least 85%. Due to the additional features discussed above that increase the ruggedness of the power module 10, the power module 10 is capable of maintaining the state discussed above for over 1000 hours, over 1500 hours, and even over 2000 hours in various embodiments.

Figure 4:
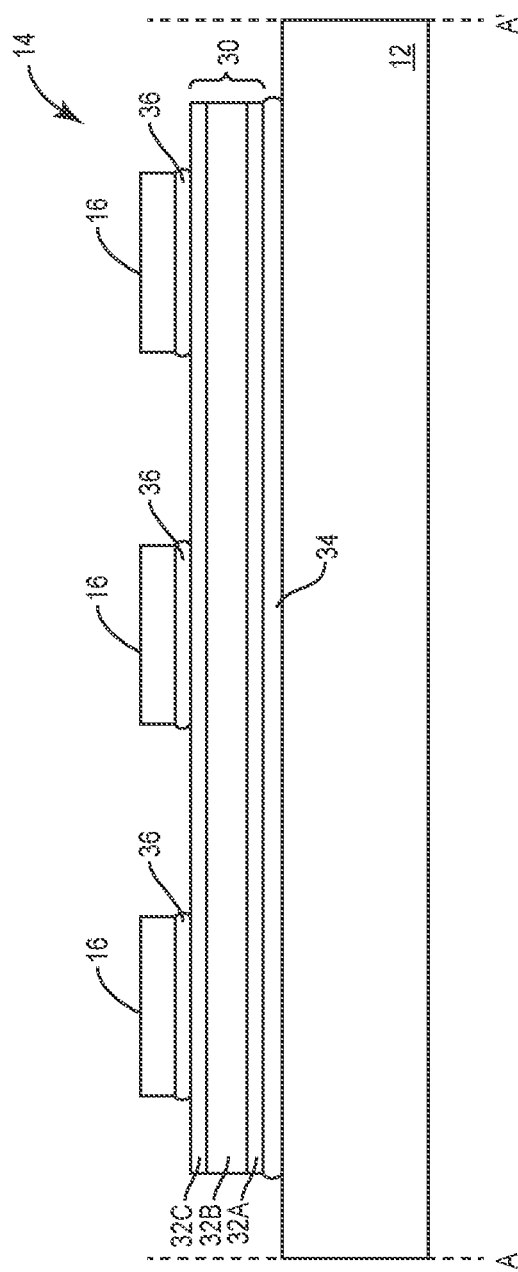
FIG. 4 is a cross-sectional view of a portion of a power module according to one embodiment of the present disclosure.

FIG. 4 shows a cross-section of the power module 10 through line A-A' in FIG. 1. As shown in FIG. 4, the power module 10 includes the baseplate 12, one of the sub-modules 14, and a number of the semiconductor die 16 on the one of the sub-modules 14. The sub-module 14 includes a power electronic substrate 30 on which the semiconductor die 16 are provided. This power electronic substrate 30 is in turn on the baseplate 12. The power electronic substrate 30 may include multiple layers, such as a first conductive layer 32A, an insulating layer 32B over the first conductive layer 32A, and a second conductive layer 32C over the insulating layer 32B. As discussed above, the power electronic substrate 30 may be chosen such that it is substantially free of silver in order to reduce the probability of electromigration therefrom towards one or more contacts of the semiconductor die 16, which may cause shorts and thus catastrophic failure thereof. Accordingly, the power electronic substrate 30 may be a direct bonded copper (DBC) substrate in some embodiments in which the first conductive layer 32A and the second conductive layer 32C are copper and the insulating layer 32B is a ceramic material such as alumina ($Al_2O_3$) aluminum oxide (AlO), aluminum nitride (AlN), and silicon nitride (SiN). The power electronic substrate 30 is attached to the baseplate 12 via a substrate attach material 34, which as discussed above, may also be substantially free of silver in various embodiments. Specifically, the substrate attach material 34 may be a solder material comprising tin and antimony. The semiconductor die 16 are attached to the power electronic substrate 30 via a die attach material 36, which as discussed above, may also be substantially free of silver in various embodiments. Specifically, the die attach material 36 may be a solder material comprising tin and antimony. Notably, many other solder materials that are substantially free of silver exist, such as solder materials comprising tin and lead, solder materials comprising tin, copper, and gold, and the like, all of which are contemplated herein.

By eliminating silver from the power module 10 as discussed above, electromigration, which may otherwise occur is eliminated. Accordingly, shorting and other failures associated with said electromigration are similarly eliminated, thus significantly increasing the ruggedness of the power module 10 as discussed above. While electromigration of silver and other metals such as nickel is a well-known phenomena in the packaging arts, it was discovered by the inventors in the course of making the power module 10 that it may significantly decrease the ruggedness of a power module including SiC semiconductor die. This is due to the power density and thus high electric fields provided by the SiC semiconductor die, which cause electromigration over distances that were previously thought to be quite safe (e.g., on the scale of µm) in terms of electromigration. In other words, such a problem has not been observed in power modules including silicon (Si) semiconductor die due to the relatively low electric fields provided thereby and thus has not necessitated such a solution.

Figure 5:
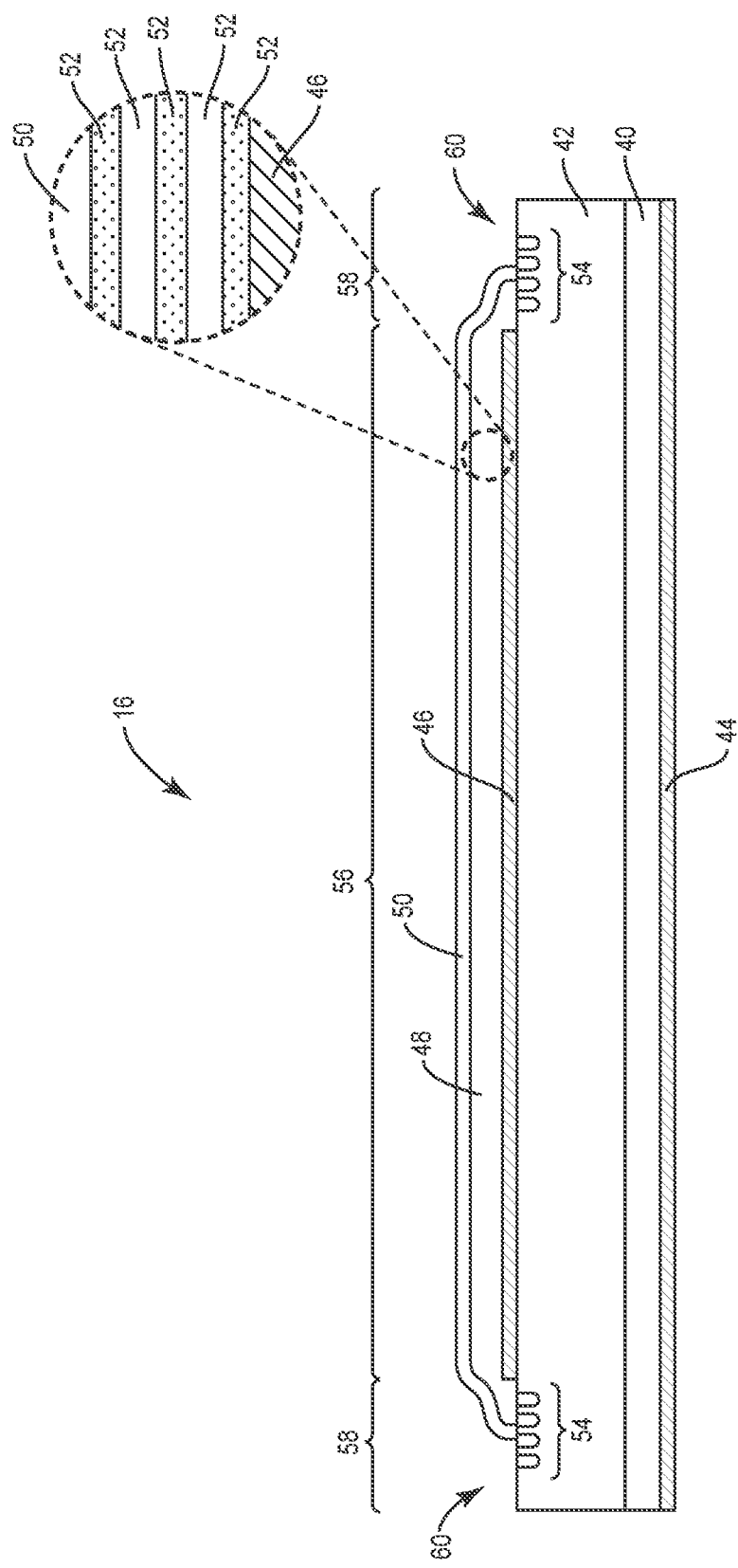
FIG. 5 is a cross-sectional view of a semiconductor die according to one embodiment of the present disclosure.

In addition to the module-level improvements discussed above, improvements are also made at each one of the semiconductor die 16. Accordingly, FIG. 5 shows a cross-sectional view of one of the semiconductor die 16 according to one embodiment of the present disclosure. The semiconductor die 16 includes a substrate 40 and a drift layer 42 over the substrate 40. A back-side metallization layer 44 is located on the substrate 40 opposite the drift layer 42. A front-side metallization layer 46 is located on the drift layer 42 opposite the substrate 40. A passivation layer stack 48 is over the front-side metallization layer 46 and the drift layer 42. An encapsulation layer 50 is over the passivation layer stack 48. While not shown to avoid obscuring the drawings, a number of devices are formed in an active region 56 of the drift layer 42. These devices may include a number of MOSFET cells or a number of diode cells, as will be appreciated by those skilled in the art and discussed in detail below. A number of guard ring implants 54 for field termination may be provided in an edge region 58 of the semiconductor die 16. A dicing street 60 may also be provided at the outermost portion of the edge region 58 where the semiconductor die 16 was singulated from a wafer.

The substrate 40 and the drift layer 42 may be SiC layers. The encapsulation layer 50 may comprise polyimide or any other suitable encapsulant. The guard ring implants 54 may be provided in the drift layer 42 by an ion implantation process, and thus may be of an opposite conductivity type of the drift layer 42.

The notable improvements to the semiconductor die 16 include the passivation layer stack 48, the material chosen for the back-side metallization layer 44, and the removal of nickel from the front-side of the semiconductor die 16. The passivation layer stack 48 includes multiple passivation layers 52 as shown in the exploded section of the drawing. Notably, the multiple passivation layers 52 are alternating layers. That is, a first one of the passivation layers 52 has a first composition, a second one of the passivation layers 52 has a second composition that is different from the first composition, and these layers alternate as shown. In one embodiment, the passivation layers 52 alternate between silicon nitride (SiN), silicon-dioxide (SiO$_2$), and silicon-oxy-nitride (SiON). Further, the passivation layers 52 may be provided in a pattern rather than an alternating fashion, such that every third layer, every fourth layer, or the like is a different composition, or such that the material composition changes between three or more materials in a repeating fashion. Alternating or patterning the passivation layers 52 in this manner ensures that any defects occurring in the deposition of these layers is interrupted by a subsequent layer having a different composition. Accordingly, pinholes and cracks cannot form through the entirety of the passivation layer stack 48, thereby protecting the underlying portions of the semiconductor die 16 from corrosion and delamination. Further, providing several passivation layers 52 increases the overall thickness of the passivation layer stack 48, which provides additional environmental protection and allows multiple ones of the passivation layers 52 to become delaminated or otherwise compromised without causing a failure of the semiconductor die 16. In one embodiment, the passivation layer stack 48 is at least 1.6 µm thick. In various embodiments, the passivation layer stack 48 may be between 1.6 µm and 10 µm thick. Specifically, the passivation layer stack 48 may be at least 2.0 µm thick, at least 2.5 µm thick, and at least 3.0 µm thick. Further, the passivation layer stack 48 may include at least five passivation layers 52, at least seven passivation layers 52, at least nine passivation layers 52, at least fifteen passivation layers 52, at least twenty passivation layers 52, and up to hundreds of passivation layers 52 without departing from the principles of the present disclosure. The thickness of the passivation layers 52 in the passivation layer stack 48 may be the same, or may vary in any desired pattern. Providing the passivation layer stack 48 as discussed above may significantly increase the ruggedness of the power module 10.

In making the power module 10, the inventors discovered that providing the passivation layers 52 using a PECVD process may increase the density and protective qualities of the passivation layers 52. However, other fabrication processes (e.g., sputtering) may also be used for the passivation layers 52 without departing from the principles of the present disclosure.

The back-side metallization layer 44 is chosen such that it is substantially free of silver. Normally, the back-side metallization layer in semiconductor die for power devices comprises tin, nickel, and silver. However, as discussed above the inventors discovered in making the power module 10 that electromigration of silver poses a large risk when using SiC semiconductor devices, even over relatively large distances that were previously thought to be safe from such phenomena. Accordingly, the back-side metallization layer 44 for the semiconductor die 16 in the power module 10 is chosen to be tin, nickel, and gold in one embodiment. Removing the silver from the back-side metallization layer 44 may substantially increase the ruggedness of the power module 10 as discussed above. Since the front-side metallization layer 46 generally does not include silver in the first place, the material thereof is not changed when compared to conventional semiconductor die for power modules. However, it should be noted that silver should also be avoided on the front-side of the device. In one embodiment, the front-side metallization layer comprises aluminum, and may include a titanium adhesion layer. In another embodiment, the front-side metallization layer comprises a metal stack with a first layer of titanium and a second layer comprising aluminum, nickel, and gold.

To improve performance in certain situations, a grounding ring has previously been provided in the dicing street 60. In these cases, the inventors discovered that nickel, which is the preferred metal in such applications, is also prone to electromigration towards one or more contacts of the semiconductor die 16 when located on the front-side of the device. Accordingly, if a grounding ring is used in the semiconductor die 16 (not shown), it should be free of both silver and nickel to prevent electromigration thereof towards one or more contacts of the semiconductor die 16 and thus failure of the die.

FIG. 6A shows a cross-sectional view of a MOSFET cell 62 according to one embodiment of the present disclosure. As discussed above, such a MOSFET cell 62 may be formed alongside many identical cells in one of the semiconductor die 16. The MOSFET cell 62 includes the substrate 40, the drift layer 42, the back-side metallization layer 44, the front-side metallization layer 46, the passivation layer stack 48, and the encapsulation layer 50. Further, the MOSFET cell 62 includes a number of implants 64 in the drift layer 42 and an oxide layer 66 between a portion of the front-side metallization layer 46 and the drift layer 42. As shown, the back-side metallization layer 44 forms a drain contact 68 of the MOSFET cell 62 while the front-side metallization layer 46 forms a source contact 70 and a gate contact 72 of the MOSFET cell 62.

FIG. 6B shows a cross-sectional view of a diode cell 74 according to one embodiment of the present disclosure. As discussed above, such a diode cell 74 may be formed alongside many identical cells in one of the semiconductor die 16. The diode cell 74 includes the substrate 40, the drift layer 42, the back-side metallization layer 44, the front-side metallization layer 46, the passivation layer stack 48, and the encapsulation layer 50. Further, the diode cell 74 includes a number of implants 76 in the drift layer 42. As shown, the back-side metallization layer 44 forms a cathode contact 78 of the diode cell 74 and the front-side metallization layer 46 forms an anode contact 80 of the diode cell 74.

Figure 7:
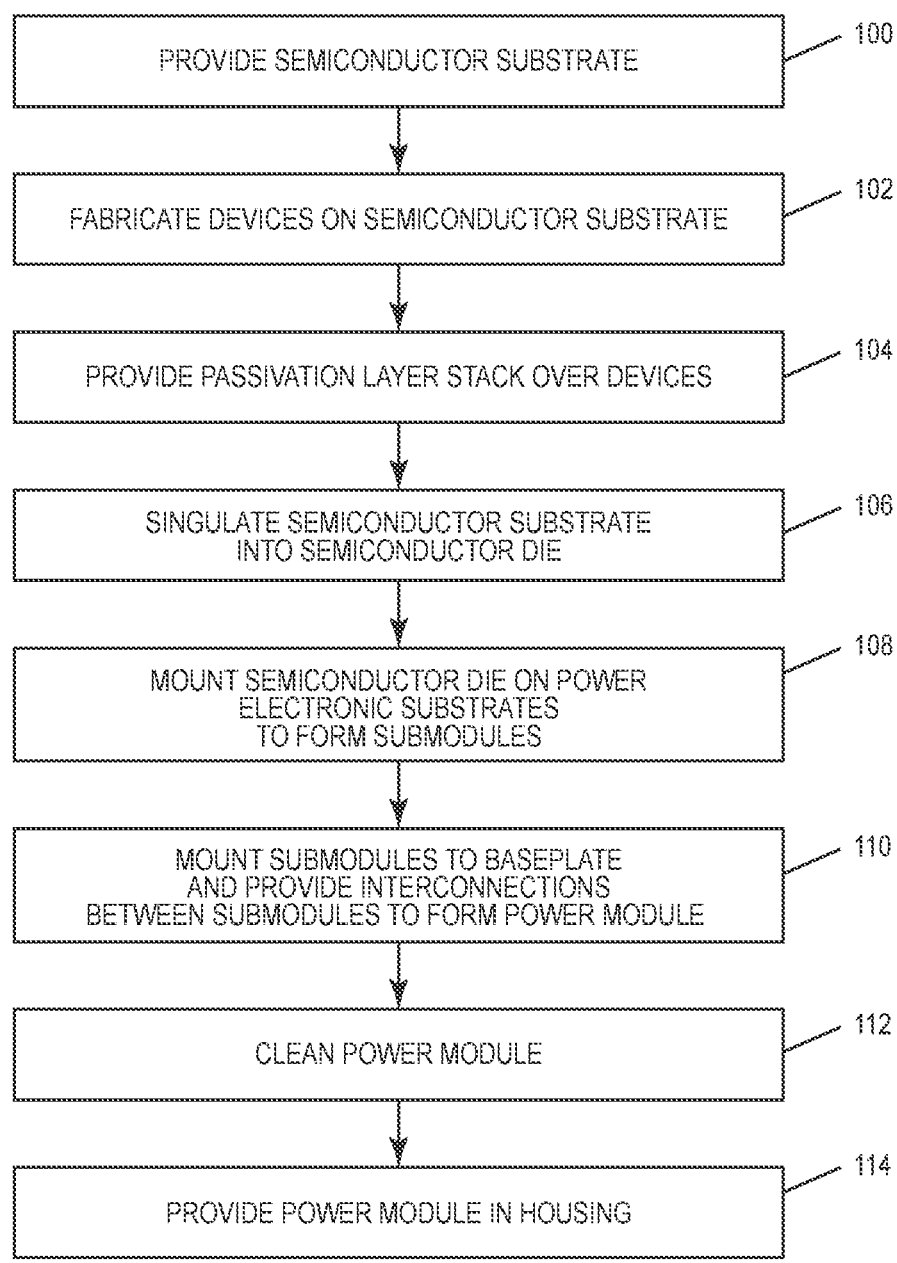
FIG. 7 is a flow diagram illustrating a process for manufacturing a power module according to one embodiment of the present disclosure.

FIG. 7 is a flow diagram illustrating a method for manufacturing the power module 10 according to one embodiment of the present disclosure. First, the semiconductor die are fabricated by providing a semiconductor substrate (step 100) and fabricating the devices (e.g., MOSFETs and/or diodes) on the semiconductor substrate (step 102). The processes for fabricating devices such as MOSFETs and diodes on a semiconductor substrate are well known and thus not discussed herein. However, the notable improvements to the semiconductor die discussed above (i.e., the improvements to the back-side metallization layer and the grounding ring) are provided during the fabrication thereof. Next, the passivation layer stack is provided over the semiconductor devices fabricated on the semiconductor substrate (step 104). As discussed above, the passivation layer stack significantly increases the ruggedness of the semiconductor die and thus the resulting power module. The semiconductor substrate is then singulated into discrete semiconductor die (step 106) that can be provided in the power module. The semiconductor die are mounted on power electronic substrates to form the submodules (step 108). As discussed above, the semiconductor die are mounted on the power electronic substrates using a die attach material that is substantially free of silver. Further, the power electronic substrate is itself substantially free of silver.

Next, the submodules are mounted to the baseplate (step 110). As discussed above, the submodules are mounted to the baseplate using a substrate attach material that is substantially free of silver. The fabricated power module is then cleaned (step 112). Specifically, the power module is subjected to a rigorous cleaning in which contaminants such as fluorine, acetate, formate, chloride, nitrite, nitrate, phosphate, sulfate, weak organic acids, lithium, sodium, ammonium, potassium, calcium, magnesium, bromide, and the like are removed from all surfaces thereof. In one embodiment, the cleaning provides contaminants at levels less than 0.5 µg/in². In various embodiments, the cleaning is sufficient to ensure that levels of one or more of these contaminants is below 0.4 µg/in², below 0.3 µg/in², below 0.2 µg/in², and even below 0.1 µg/in². In making the power module 10, the inventors discovered that these low contamination levels were necessary for avoiding corrosion and other issues that cause failure of the power module 10 during the THB80 tests discussed above. The power module is then provided in a housing, and in some embodiments, the housing is filled with a potting material such as a silicone gel (step 114).

In various embodiments, all of the materials chosen for the power module 10, including the baseplate 12, the power electronic substrate 30, the substrate attach material 34, the die attach material 36, and any other material near or in contact with the semiconductor die (e.g., the silicone gel discussed above which is provided around the power module 10 when it is provided in a housing) are chosen based on ion chromatography such that certain contaminants therein are significantly lower than what is currently accepted as standard in the industry. When using materials chosen according to industry standards, the inventors found that even the recommended low level of contaminants allowed by these standards was enough to cause corrosion and other defects during the THB80 tests discussed above. Accordingly, the inventors discovered that all materials in contact with active current paths in the power module 10 should have levels of contaminants such as fluorine, acetate, formate, chloride, nitrite, nitrate, phosphate, sulfate, weak organic acids, lithium, sodium, ammonium, potassium, calcium, magnesium, and bromide below 0.5 µg/in². In various embodiments, the levels of one or more of these contaminants is chosen to be below 0.4 µg/in², below 0.3 µg/in², below 0.2 µg/in², and even below 0.1 µg/in². Where industry standards allow for the same contaminant levels to be up to 6 µg/in² in some cases, once again the inventors discovered these values to be much too high to provide desirable ruggedness of the power module 10.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor die comprising:
   a substrate;
   a drift layer on the substrate;
   a front-side metallization layer on the drift layer opposite the substrate; and
   a passivation layer stack on the drift layer and the front-side metallization layer such that the passivation layer stack provides protection for the front-side metallization layer, the passivation layer stack comprising at least four passivation layers such that a composition of the at least four passivation layers alternates between at least a first material and a second material.

2. The semiconductor die of claim 1 wherein the first material and the second material are different ones of silicon nitride (SiN), silicon-dioxide ($SiO_2$), and silicon-oxy-nitride (SiON).

3. The semiconductor die of claim 1 wherein the passivation layer stack has a thickness of at least 1.6 µm.

4. The semiconductor die of claim 1 further comprising a back-side metallization layer directly on the substrate opposite the drift layer, wherein the back-side metallization layer is substantially free of silver.

5. The semiconductor die of claim 1 wherein the passivation layer stack comprises at least five passivation layers.

6. The semiconductor die of claim 1 wherein a metal-oxide-semiconductor field-effect transistor (MOSFET) is formed in the drift layer.

7. A semiconductor die comprising:
   a substrate;
   a drift layer on the substrate; and
   a back-side metallization layer directly on the substrate opposite the drift layer, wherein the back-side metallization layer is substantially free of silver.

8. The semiconductor die of claim 7 wherein:
   a metal-oxide-semiconductor field-effect transistor (MOSFET) is formed in the drift layer; and
   the back-side metallization layer provides a drain contact of the MOSFET.

9. The semiconductor die of claim 8 wherein:
   a Schottky diode is formed in the drift layer; and
   the back-side metallization layer provides an anode contact of the Schottky diode.

10. The semiconductor die of claim 7 wherein:
a Schottky diode is formed in the drift layer; and
the back-side metallization layer provides an anode contact of the Schottky diode.

11. The semiconductor die of claim 7 wherein the back-side metallization layer comprises tin, nickel, and gold.

12. The semiconductor die of claim 7 further comprising a front-side metallization layer on the drift layer opposite the substrate, wherein the front-side metallization layer comprises a first layer of titanium and a second layer comprising aluminum, nickel, and gold on the first layer.

13. A semiconductor die comprising:
a substrate;
a drift layer on the substrate;
a front-side metallization layer on the drift layer opposite the substrate; and
a passivation layer stack on the drift layer and the front-side metallization layer such that the passivation layer stack provides protection for the front-side metallization layer, the passivation layer stack comprising at least four passivation layers.

14. The semiconductor die of claim 13 wherein the passivation layer stack is at least 1.6 μm thick.

15. The semiconductor die of claim 13 wherein the passivation layer stack comprises at least five passivation layers.

16. The semiconductor die of claim 13 further comprising a back-side metallization layer on the substrate opposite the drift layer, wherein the back-side metallization layer is substantially free of silver.

17. The semiconductor die of claim 16 wherein a metal-oxide-semiconductor field-effect transistor (MOSFET) is formed in the drift layer.

18. The semiconductor die of claim 17 wherein the back-side metallization layer provides a drain contact of the MOSFET.

19. The semiconductor die of claim 16 wherein a Schottky diode is formed in the drift layer.

20. The semiconductor die of claim 19 wherein the back-side metallization layer provides an anode contact of the Schottky diode.

21. The semiconductor die of claim 6 further comprising a back-side metallization layer on the substrate opposite the drift layer, wherein the back-side metallization layer forms a drain contact of the MOSFET and the back-side metallization layer is substantially free of silver.

\* \* \* \* \*